(12) United States Patent
Tsukamoto (10) Patent No.: US 6,504,500 B1
(45) Date of Patent: Jan. 7, 2003

(54) A/D CONVERTER AND A/D CONVERTING METHOD

(75) Inventor: Sanroku Tsukamoto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/712,208

(22) Filed: Nov. 15, 2000

(30) Foreign Application Priority Data

Jun. 8, 2000  (JP) ........................................ 2000-171734

(51) Int. Cl.$^7$ ................................................ H03M 1/38
(52) U.S. Cl. ........................................ 341/155; 341/161
(58) Field of Search ................................. 341/155, 158, 341/136, 161, 163, 159, 164, 156, 122

(56) References Cited

U.S. PATENT DOCUMENTS

| 4,667,180 A | | 5/1987 | Robinson ..................... 341/155 |
| 4,994,808 A | * | 2/1991 | Wichelman ................. 341/161 |
| 5,017,920 A | * | 5/1991 | French ........................ 341/161 |
| 5,194,867 A | * | 3/1993 | Fisher .......................... 341/159 |
| 5,465,092 A | * | 11/1995 | Mayes et al. ................ 341/155 |
| 5,821,893 A | * | 10/1998 | Kumamoto et al. ......... 341/161 |
| 6,218,975 B1 | * | 4/2001 | Tsukamoto et al. ......... 341/159 |

OTHER PUBLICATIONS

Joseph Ingino Jr. et al., "A Continuously–Calibrated 10MSample/s 12b 3.3V ADC", Digest of Technical Papers, pp. 144–145 (Feb., 1998).

* cited by examiner

*Primary Examiner*—Peguy JeanPierre
*Assistant Examiner*—Jean Bruner JeanGlaude
(74) *Attorney, Agent, or Firm*—Arent Fox Kintner Plotkin & Kahn, PLLC

(57) ABSTRACT

An A/D converter includes a bit cell for converting an analog input signal to a single-bit digital signal. The bit cell includes an operational circuit for performing at least one of a first operation (Vin−VRH)+(Vin−VRL) and a second operation (VRH−Vin)+(VRL−Vin), where VRH is a high potential reference voltage, VRL is a low potential reference voltage and Vin is the analog input signal.

39 Claims, 7 Drawing Sheets

A/D CONVERTER AND A/D CONVERTING METHOD

BACKGROUND OF THE INVENTION

The present invention relates to an analog-to-digital (A/D) converter and an A/D converting method, and more particularly, to a series-connected A/D converter, such as a successive approximation A/D converter, a cyclic comparison A/D converter, and a pipeline A/D converter.

An A/D converter converts an analog signal to a digital signal having n bits and typically includes a stage, which is referred to as a bit cell, and an analog block, which performs an n number of operations.

The analog block of a successive approximation A/D converter is provided with a single bit cell (stage). The output signal of the bit cell is fed back to the input terminal of the A/D converter. The bit cell performs an n number of operations to generate a digital signal having n bits.

The analog block of a cyclic comparison A/D converter has an m number ($2 \leq m < n$) of bit cells. The output of the last bit cell (bit cell number m) is fed back to the input terminal of the first bit cell. The bit cells perform an n/m number of operations to generate a digital signal having n bits.

The analog block of a pipeline A/D converter is provided with an n number of bit cells. Each of these bit cells performs a single operation to generate a digital signal having n bits.

Figure 1:
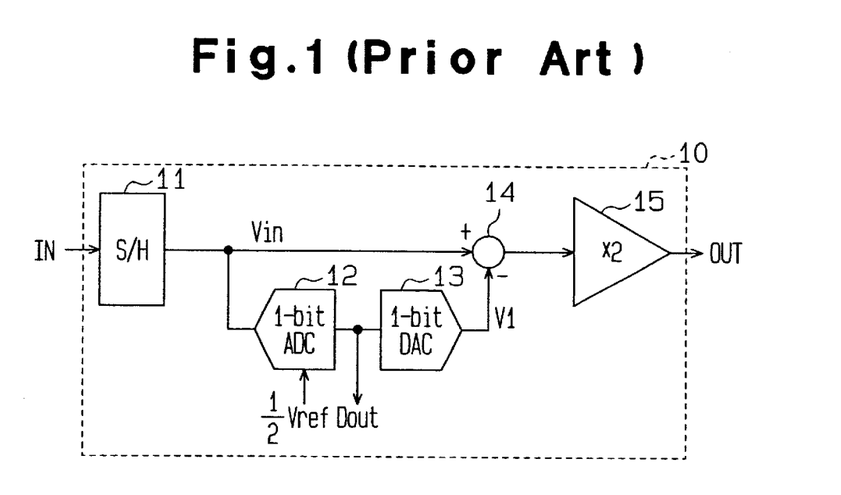
FIG. 1 is a schematic block diagram of a prior art bit cell.

FIG. 1 is a schematic block diagram showing a prior art bit cell 10.

The bit cell 10 includes a sample-and-hold (S/H) circuit 11, a single-bit analog-to-digital converter (ADC) 12, a single-bit digital-to-analog converter (DAC) 13, a subtractor 14, and an amplifier 15.

The S/H circuit 11 samples and holds an input signal IN. Then, the S/H circuit 11 provides the held analog signal Vin to the ADC 12 and the subtractor 14.

The ADC 12 receives a median voltage ½Vref of a conversion range (input range) and compares the median voltage ½Vref with the analog signal Vin to generate a single-bit digital signal Dout. Then, the ADC 12 provides the digital signal Dout to the DAC 13.

In response to the digital signal Dout, the DAC 13 generates an analog signal V1 having the median voltage ½Vref or a potential of zero volts (V). The DAC 13 then provides the analog signal V1 to the subtractor 14.

The subtractor 14 subtracts the analog signal V1 from the analog signal Vin and provides the amplifier 15 with the subtraction signal. The amplifier 15 has a gain of two and amplifies the subtraction signal to generate an amplified subtraction signal OUT.

Figure 2:
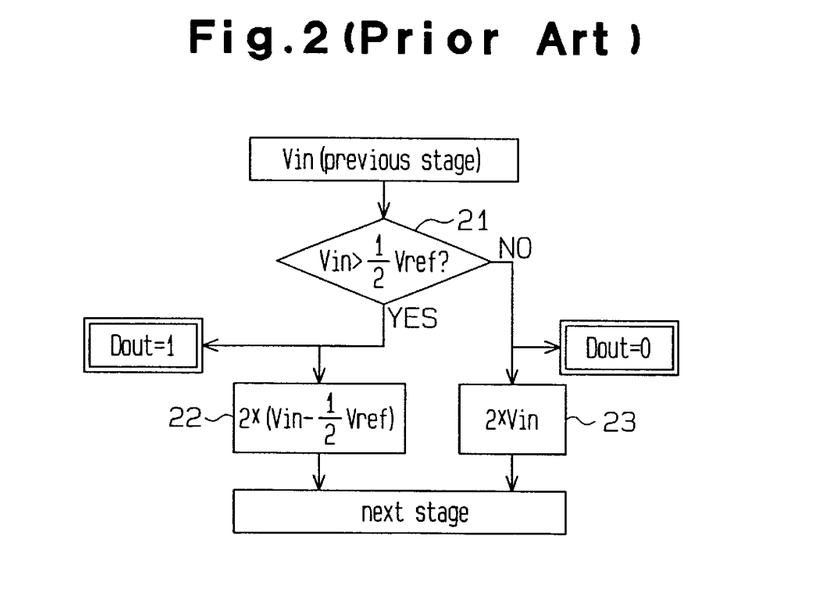
FIG. 2 is an explanatory diagram illustrating the algorithm performed by the prior art A/D converter.
Figure 3:
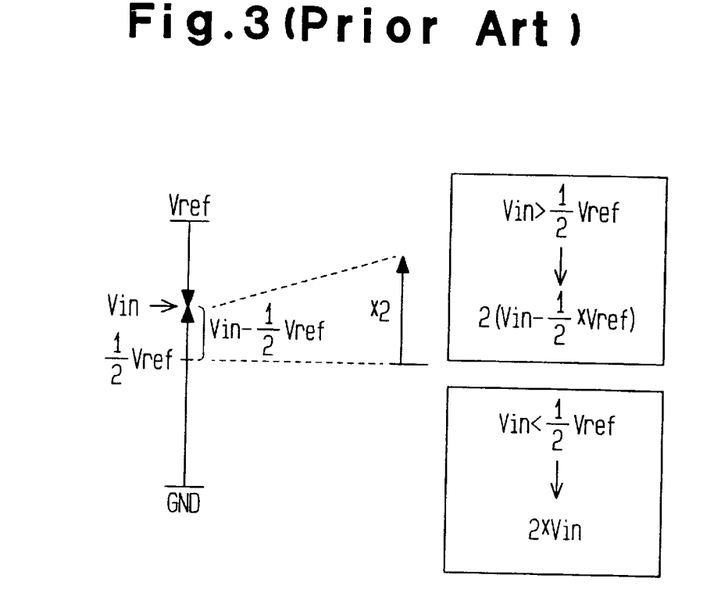
FIG. 3 is a diagram illustrating the operation of the prior art bit cell.
Figure 4:
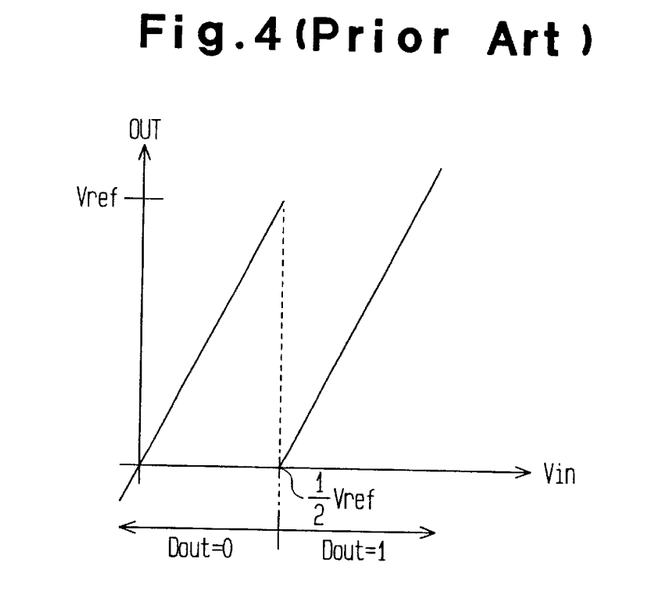
FIG. 4 is a graph illustrating the transmission characteristic of the prior art bit cell.
Figure 5:
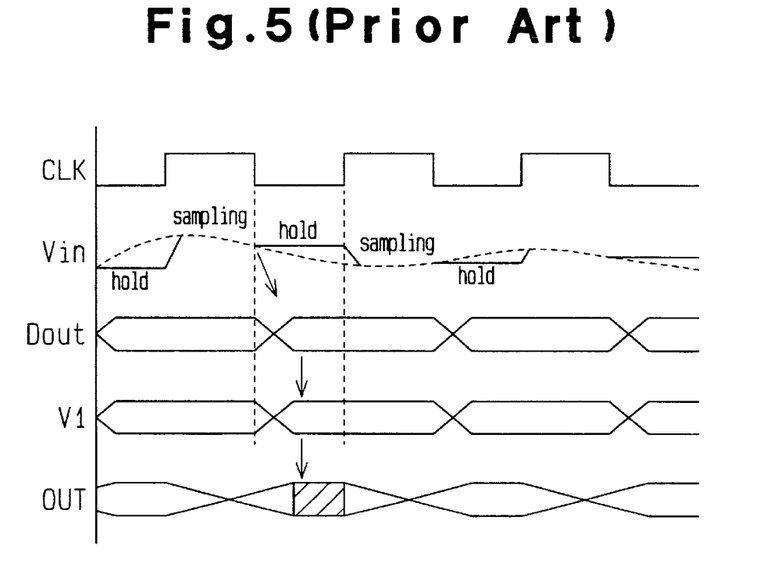
FIG. 5 is a timing chart illustrating the operation of the bit cell of FIG. 1.

FIG. 2 is a diagram illustrating an algorithm performed by the bit cell 10, and FIG. 3 is a diagram illustrating the operation of the bit cell 10. FIG. 4 is a graph showing the relationship between the analog signal of the bit cell 10 and a reference voltage. FIG. 5 is a timing chart of the bit cell 10.

The analog signal Vin provided from an external (i.e., previous) bit cell (stage) is compared with the median voltage ½Vref of the conversion range (step 21). This generates a single-bit digital signal Dout of "0" or "1". Then the digital signal Dout undergoes a mathematical operation of 2 (Vin−½×Vref) or 2×Vin (steps 22, 23). The operation result is transferred to the next bit cell.

However, the prior art method has the shortcomings listed below.

(a) An absolute median voltage ½×Vref must be generated. Further, a DAC is required to perform the mathematical operations and comparisons.

(b) The amplifier 15, which has an amplification rate of two times, is required. This may produce an error during a mathematical operation that is caused by factors, such as the gain and offset of the amplifier 15.

(c) The DAC 13, which generates the signal V1 having zero volts or the median voltage ½×Vref, is required. This may produce an error during operation that is caused by factors, such as the settling characteristic of the DAC 13.

(d) The comparison between the absolute median voltage ½×Vref and the analog signal Vin may produce an error resulting from a sampling error produced during the high-speed comparison process.

(e) Settling error is produced as the speed of the operation process increases. This affects the A/D conversion accuracy.

The above shortcomings are described in detail in Ingino Jr., Joseph and Wooley, Bruce , A Continuously-Calibrated 10MSample/s 12b 3.3V ADC, ISSCC Digest of Technical Papers, Feb. 1998, pp. 144–145.

SUMMARY OF THE INVENTION

It is an object of the present invention to provide a highly accurate A/D converter and A/D conversion method that enable high-speed operation.

To achieve the above object, the present invention provides an A/D converter comprising a bit cell for converting an analog input signal to a single-bit digital signal. The bit cell includes an operational circuit for performing at least one of a first operation (Vin−VRH)+(Vin−VRL), and a second operation (VRH−Vin)+(VRL−Vin). VRH is a high potential reference voltage, VRL is a low potential reference voltage, and Vin is the voltage of the analog input signal.

A further aspect of the present invention provides an A/D converter comprising a bit cell for converting an analog input signal to a single-bit digital signal. The bit cell includes a first operational circuit for performing a first operation Vin−VRH to obtain a first operation result Va, a second operational circuit for performing a second operation Vin−VRL to obtain a second operation result Vb, and a third operational circuit connected to the first and second operational circuits to perform a third operation Va+Vb and obtain a third operation result. VRH is a high potential reference voltage, VRL is a low potential reference voltage, and Vin is the voltage of the analog input signal.

Another aspect of the present invention provides an A/D converter comprising a bit cell for converting an analog input signal to a single-bit digital signal. The bit cell includes a first operational circuit for performing a first operation VRH−Vin to obtain a first operation result Va, a second operational circuit for performing a second operation VRL−Vin to obtain a second operation result Vb, and a third operational circuit connected to the first and second operational circuits to perform a third operation Va+Vb and obtain a third operation result. VRH is a high potential reference voltage, VRL is a low potential reference voltage, and Vin is the voltage of the analog input signal.

A further aspect of the present invention provides an A/D converter comprising a bit cell for converting an analog input signal to a digital signal. The bit cell includes a sample-and-hold circuit for sampling and holding the analog input signal, a first operational circuit for obtaining the difference between a voltage of the sampled and held analog signal and a high potential reference voltage to generate a first differential voltage signal, a second operational circuit for obtaining the difference between the voltage of the sampled and held analog signal and a low potential reference voltage to generate a second differential voltage signal, a comparator connected to the first and second operational circuits to compare the first and second differential voltage signals, and a third operational circuit connected to the first and second operational circuit to add the first differential voltage signal and the second differential voltage signal to generate complementary first and second analog output signals. The comparator outputs one of the first and second analog output signals.

Another aspect of the present invention provides a method for converting an analog input signal to a digital signal. The method comprises the steps of computing a difference between the analog input signal and a high potential reference voltage to obtain a first operation result, computing a difference between the analog input signal and a low potential reference voltage to obtain a second operation result, computing a sum of the first and second operation results to obtain a third operation result, generating one of a first digital signal and a second digital signal by determining whether the third operation result is positive, and outputting one of the third operation result and an inverse of the third operation result based on the determination result.

A further aspect of the present invention provides a method for converting an analog input signal to a digital signal. The method comprises the steps of sampling and holding the analog input signal, computing the difference between a voltage of the sampled and held analog signal and a high potential reference voltage to obtain a first operation result, computing the difference between the voltage of the sampled and held analog signal and a low potential reference voltage to obtain a second operation result, comparing the first and second operation results to generate one of a first digital signal and a second digital signal, computing the sum of the first and second operation results to obtain a third operation result, and outputting one of the third operation result and an inverse of the third operation result based on the generated one of the first and second digital signals.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 6:
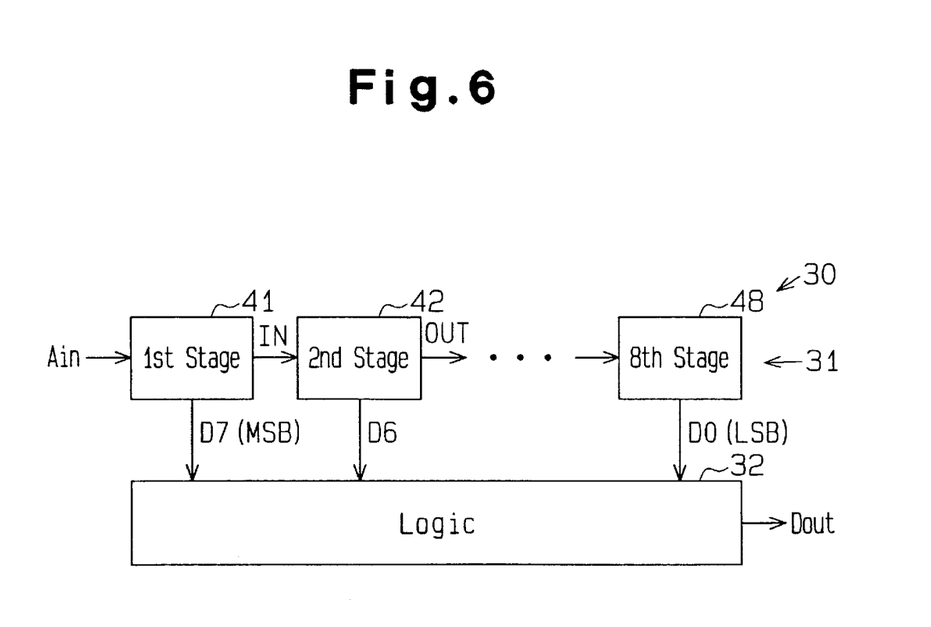
FIG. 6 is a schematic block diagram of a pipeline A/D converter according to a preferred embodiment of the present invention.

In the drawings, like numerals are used for like elements throughout. FIG. 6 is a schematic block diagram of a pipeline A/D converter 30 according to a preferred embodiment of the present invention. The A/D converter 30 converts an analog input signal Ain to an eight-bit digital signal Dout.

The A/D converter 30 is provided with an analog block 31 and a logic circuit 32. The analog block 31 includes bit cells (stages) 41 to 48, the number (eight in this embodiment) of which corresponds to the bit number of the digital signal Dout. Each of the bit cells 41–48 is a conversion stage for converting an input signal to a single-bit digital signal.

The first to eighth bit cells (first to eighth stages) 41–48 are connected in series. The first bit cell 41 is provided with the analog input signal Ain, and the second to eighth bit cells 42–48 are each provided with the output signal of the preceding bit cell (first to seventh bit cells 41–47).

The first bit cell 41 performs a mathematical operation using the analog signal Ain to generate a single-bit digital signal D7, which is provided to the logic circuit 32. Further, the first bit cell 41 provides the next, second bit cell 42 with an analog signal based on the mathematical operation result.

In the same manner, each of the seven bit cells 42–47 performs a mathematical operation using the analog signal input from the preceding bit cell to provide the logic circuit 32 with a single-bit digital signal and the next, related bit cell with an analog output signal based on the mathematical operation result.

The eighth bit cell 48 performs a mathematical operation using the analog signal provided from the seventh bit cell 47. Based on the result, the eighth bit cell 48 provides a digital signal D0 to the logic circuit 32.

Figure 7:
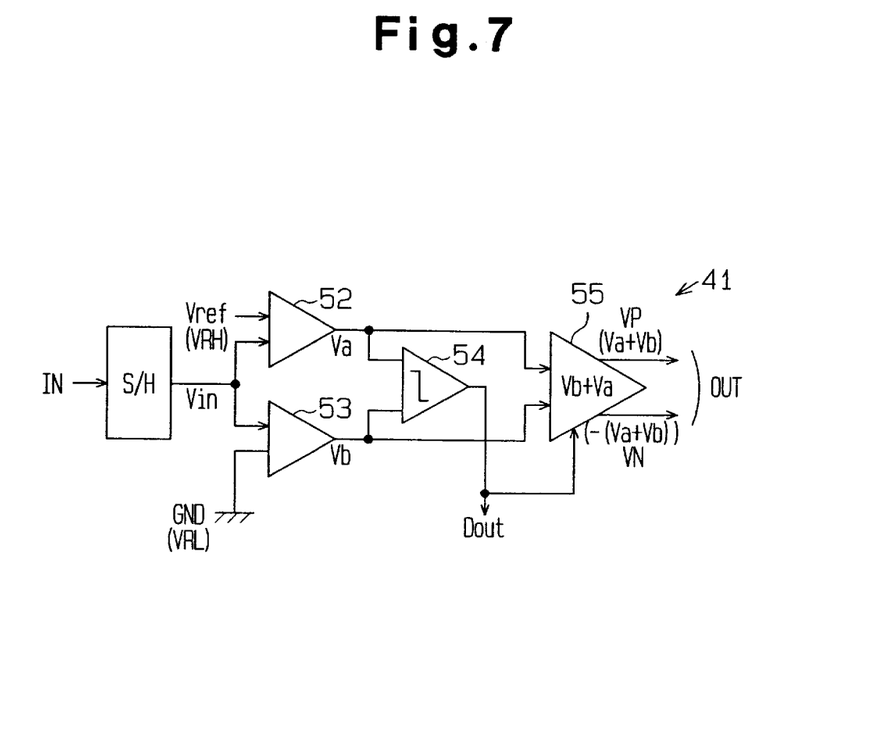
FIG. 7 is a schematic block diagram of a bit cell of the A/D converter of FIG. 6.

FIG. 7 is a schematic block diagram of the first bit cell 41. The second to eighth bit cells 42–48 each have a configuration identical to that of the first bit cell 41 and will thus not be described below.

The first bit cell 41 includes a sample-and-hold (S/H) circuit 51, first and second operational circuit 52, 53, a comparator 54, and a third operational circuit 55.

Figure 8:
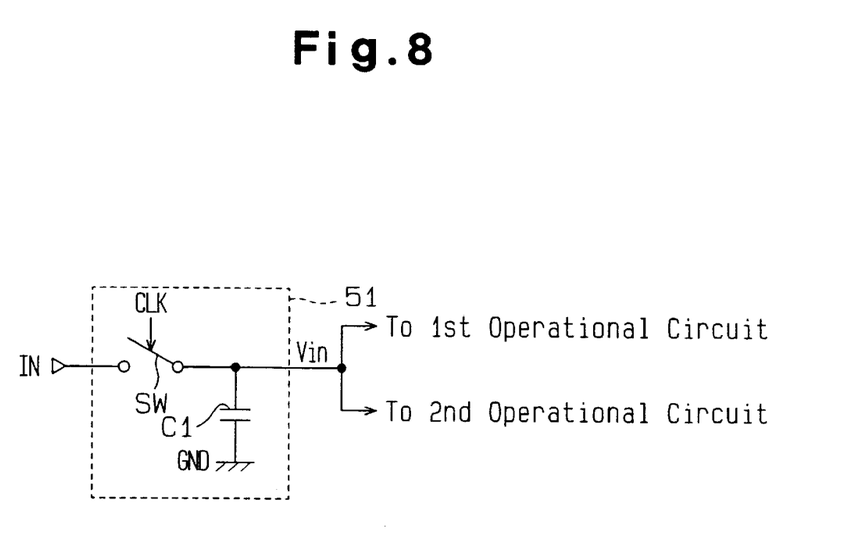
FIG. 8 is a circuit diagram of an S/H circuit of the bit cell shown of FIG. 7.

With reference to FIG. 8, the S/H circuit 51 includes a switch SW and a capacitor C1. The switch SW has a first terminal provided with an input signal IN and a second terminal connected to a first terminal of the capacitor C1. A second terminal of the capacitor C1 is connected to the ground GND. A node between the switch SW and the capacitor C1 is connected to the first and second operational circuits 52, 53, which are provided with the analog signal Vin from the S/H circuit 51.

The switch SW goes on and off in accordance with, for example, a sampling clock CLK provided by the logic circuit 32. The input signal IN is sampled by the capacitor C1 when the switch SW goes on and held by the capacitor C1 when the switch SW goes off. The held input signal IN is provided as the analog signal Vin from the S/H circuit 51 to the first and second operational circuits 52, 53.

The first operational circuit 52 is provided with the analog signal Vin and a high potential reference voltage VRH. The second operation circuit 53 is provided with the analog signal Vin and a low potential reference voltage VRL.

In the preferred embodiment, a first comparison voltage Vref is used as the high potential reference voltage VRH, and a second comparison voltage GND (0V) is used as the low potential reference voltage VRL. The voltages VRH and Vref and the voltages VRL and GND will be used interchangeably below.

Figure 9:
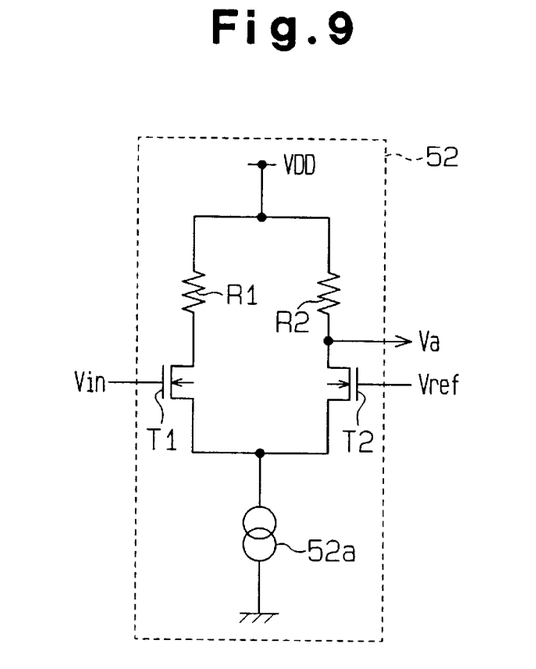
FIG. 9 is a circuit diagram of an operational block of the bit cell shown in FIG. 7.

With reference to FIG. 9, the first operational circuit 52 is a subtractor (differential circuit). The first operational circuit 52 includes transistors T1, T2, resistors R1, R2, and a constant-current source 52a. It is preferred that each of the transistors T1, T2 be an n-channel MOS transistor. The sources of the transistors T1, T2 are connected to each other, and their connection node is connected to the low potential power supply (in the preferred embodiment, the ground) GND via the constant-current power supply 52a. The drains of the transistors T1, T2 are connected to a high potential power supply VDD via the resistors R1, R2, respectively. The analog signal Vin is applied to the gate of the first transistor T1, and the first comparison voltage Vref is applied to the gate of the second transistor T2. A first differential voltage Va is output from a node between the second transistor T2 and the resistor R2.

The first operational circuit 52 computes a voltage difference between the analog signal Vin and the first comparison voltage Vref (Vin−Vref=Vin−VRH). Then, the first operation circuit 52 outputs the voltage difference as the first differential voltage Va.

Since the second operational circuit 53 is a subtractor similar to the first operational circuit 52, the second operational circuit 53 is not illustrated. The second operational circuit 53 calculates the voltage difference between the analog signal Vin and the second comparison voltage GND (Vin−GND=Vin−VRL) and outputs the voltage difference as a second differential voltage Vb. The first differential voltage Va may also be represented by voltage difference (Vref−Vin), and the second differential voltage Vb may also be represented by voltage difference (GND−Vin).

The comparator 54 receives and compares the first and second differential voltages Va, Vb and generates a single-bit digital signal Dout (the digital signal D7 in FIG. 6) having a logic value based on the comparison result. For example, if the absolute value of the first differential Ratio voltage Va is greater than the absolute value of the second differential voltage Vb, that is, if the analog signal Vin is smaller than the median voltage ½×Vref, the signal Dout output by the comparator 54 is logical 0. On the other hand, if the absolute value of the first differential voltage Va is smaller than the absolute value of the second differential voltage Vb, that is, if the analog signal Vin is greater than the median voltage ½×Vref, the signal Dout output by the comparator 54 is logical 1.

The third operational circuit 55 receives the first and second differential voltages Va, Vb and the digital signal Dout. Further, the third operational circuit 55 is an adder that adds the first and second differential voltages Va, Vb and generates complementary first and second voltages VP(Va+Vb), VN(−(Va+Vb)). The third operational circuit 55 outputs an analog output signal OUT in accordance with the logic of the digital signal Dout. That is, the third operational circuit 55 outputs a first voltage VP as the analog output signal OUT when the signal Dout is 1 and a second voltage VN as the analog output signal OUT when the signal Dout is 0.

The operation of the first bit cell 41 will now be described.

Figure 10:
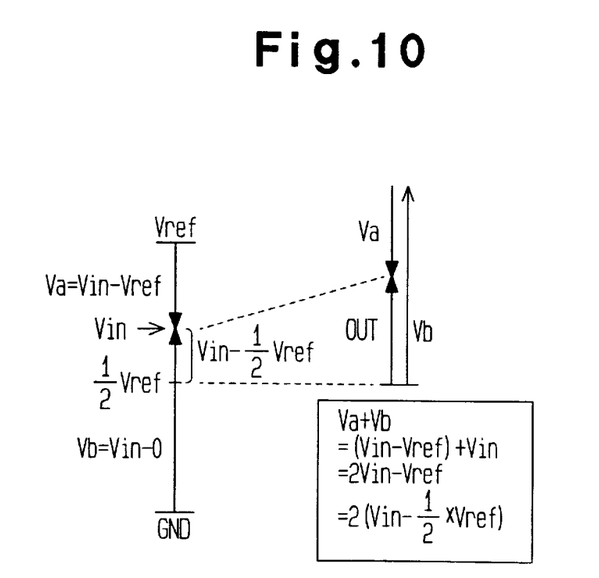
FIG. 10 is an explanatory diagram illustrating the operation of the bit cell shown in FIG. 7.

Referring to FIG. 10, the analog signal Vin, which has a predetermined potential (½Vref<Vin<Vref), is provided to the first and second operational circuits 52, 53 via the S/H circuit 51.

The first operational circuit 52 outputs the differential voltage between the analog signal Vin and the first comparison voltage Vref (Vin−Vref), or the first differential voltage Va having a negative code. The second operational circuit 53 outputs the differential voltage (Vin−GND) between the analog signal Vin and the second comparison voltage GND, or the second differential voltage Vb having a positive code.

The first and second differential voltages Va, Vb are determined upon completion of sampling. Accordingly, the comparator 54 immediately performs a comparison process when the sampling is completed to output the logical 1 single-bit digital signal Dout.

When sampling is completed, the third operational circuit 55 immediately performs a mathematical operation using the determined first and second differential voltages Va, Vb. That is, the third operational circuit 55 performs the mathematical operation in parallel with the comparison process performed by the comparator 54. The third operational circuit 55 outputs the first voltage VP in accordance with the digital signal Dout and outputs the first voltage VP as the analog output signal OUT. The potential Vout of the analog output signal OUT is as follows:

$$Vout = Va + Vb$$
$$= (Vin - Vref) + (Vin - 0)$$
$$= 2 \times Vin - Vref$$
$$= 2(Vin - 1/2 \times Vref).$$

The potential Vout is equal to the potential Vout of the conventional analog output signal OUT obtained by directly comparing the analog signal Vin and the median potential ½×Vref and multiplying the comparison result by two times.

Accordingly, in the preferred embodiment, the median potential ½×Vref is virtually determined based on the first comparison voltage Vref and the second comparison voltage GND. The median potential ½×Vref and the analog signal Vin are then compared to generate the single-bit digital signal Dout and the analog signal OUT transmitted to the next stage. In other words, each of the bit cells 41–48 functions as a comparison stage for comparing the analog signal Vin with the median potential ½×Vref, which is virtually determined based on the first comparison voltage Vref and the second comparison voltage GND.

Figure 11:
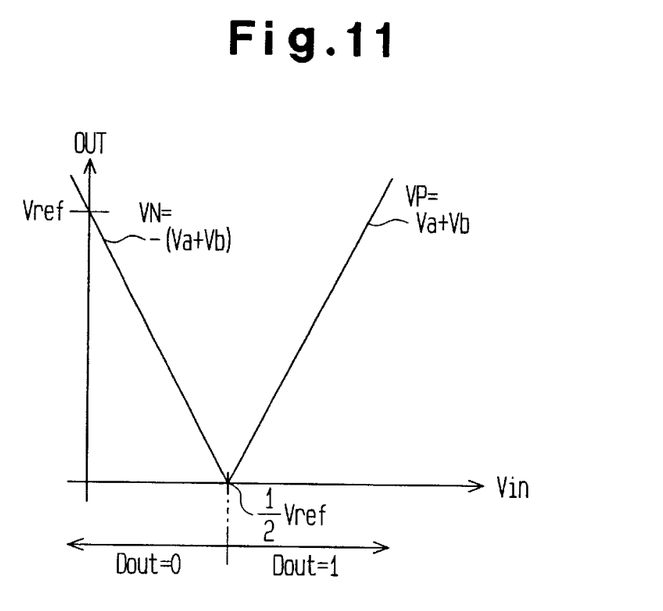
FIG. 11 is a graph illustrating the transmission characteristic of the bit cell shown in FIG. 7.

If the analog signal Vin is lower than the median potential ½Vref, the third operational circuit 55 outputs the second voltage VN (−(Va+Vb)). Accordingly, the transmission characteristic of the bit cell 41 is as shown in FIG. 11.

Figure 12:
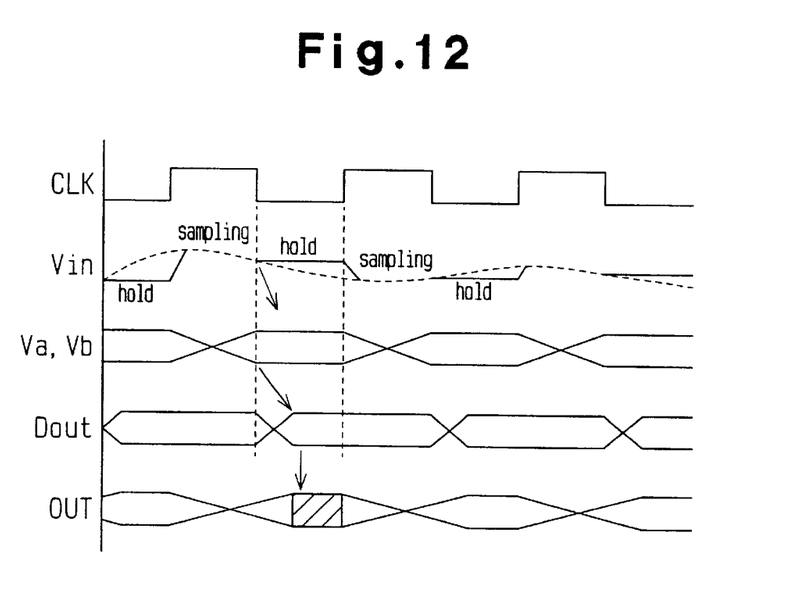
FIG. 12 is a timing chart illustrating the operation of the bit cell shown in FIG. 7.

FIG. 12 is a timing chart illustrating the operation of the bit cell. The first and second differential voltages Va, Vb are determined upon completion of sampling (trailing edge of the sampling clock). This starts the mathematical operation of the digital signal Dout and the analog signal OUT at an earlier time in comparison to the prior art, and determines the digital signal Dout and the analog signal OUT within the hold time (the period during which the clock CLK is low).

Figure 13:
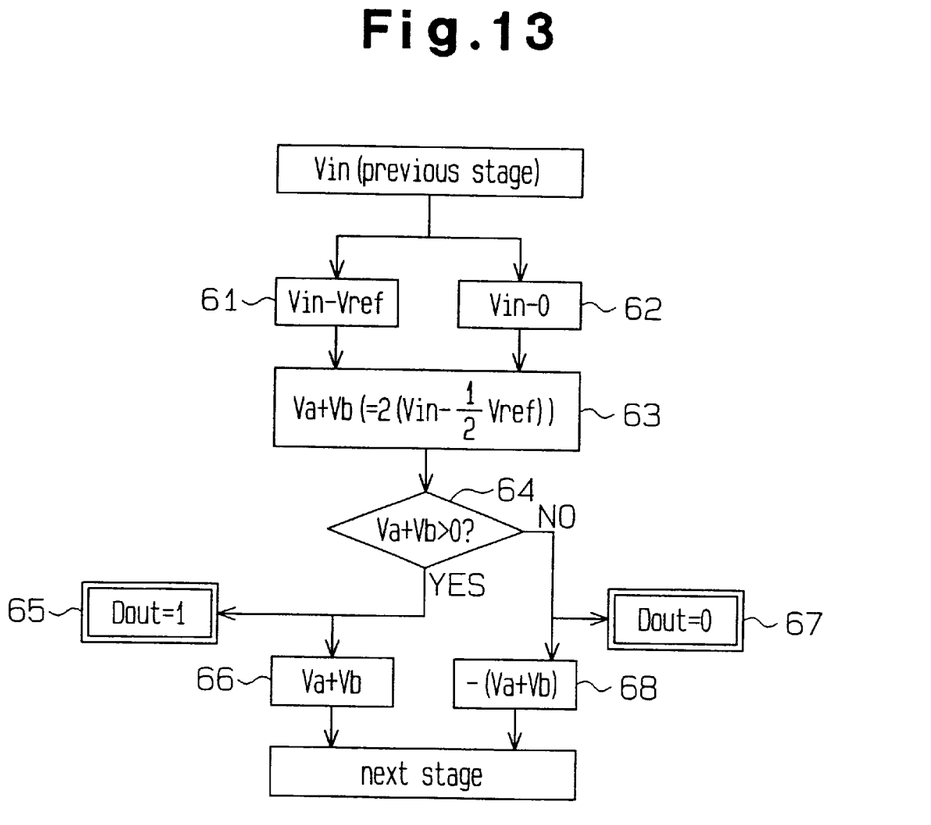
FIG. 13 is a diagram illustrating the algorithm performed by the A/D converter of FIG. 6.

FIG. 13 is a schematic diagram illustrating the A/D conversion method according to the present invention. The algorithm illustrated in the diagram may be performed by any one of a software and a hardware.

As shown in FIG. 13, the first comparison voltage Vref and the second comparison voltage GND are each subtracted from the analog signal Vin provided from an external device via an S/H circuit (steps 61, 62). Then, the two subtraction results, or the first differential voltage Va and the second differential voltage Vb, are added. The sum is equal to two times the difference between the analog signal Vin and the virtual reference potential ½×Vref (step 63).

Next, it is determined whether the value of the sum is positive (step 64). If the sum is a positive value a digital signal Dout that is, for example, logical 1 is output (step 65), and the sum is output as an analog output signal OUT (Va+Vb) (step 66).

If the sum is a negative value, a digital signal Dout that is, for example, logical 0 is output (step 67). As a result, an analog output signal OUT (−(Va+Vb)) having an inversed potential of the sum is output.

The A/D converter 30 and the A/D conversion method of the preferred embodiment have the advantages described below.

(1) The first operational circuit 52 outputs the first differential voltage Va (Vin−Vref), and the second operational circuit 53 outputs the second differential voltage Vb (Vin−0). The third operational circuit 55 generates an analog signal by adding the first and second differential voltages Va, Vb (Va+Vb). The analog output signal OUT has the same value as the analog output signal (2(Vin−½×Vref)) obtained through the conventional method.

In other words, the A/D converter 30 obtains the same results without using the conventional DAC and the 2× amplifier. Accordingly, the A/D converter 30 is not affected by a DAC or a 2× amplifier (e.g., settling time and offset). Thus, A/D conversion is accurately performed at a high speed. Further, current consumption is decreased.

(2) The first and second operational circuits 52, 53 perform mathematical operations based on the analog signal Vin provided by the S/H circuit 51. Accordingly, the processing results of the operational circuits 52, 53 are determined upon completion of sampling. Thus, the processing of the digital signal Dout and the analog signal OUT are started at an earlier time in comparison with the prior art. As a result, the digital signal Dout and the analog output signal OUT are determined within the hold time (the period during which the clock CLK is low), and the speed of the A/D converter is increased.

It should be apparent to those skilled in the art that the present invention may be embodied in many other specific forms without departing from the spirit or scope of the invention. Particularly, it should be understood that the present invention may be embodied in the following forms.

Each of the eight bit cells 41–48 may be provided with a single circuit having a plurality of functions or a plurality of circuits achieving a single function.

For example, an operational circuit integrating the first and second operational circuits 52, 53 may be employed. Alternatively, an operational circuit integrating the third operational circuit 55 and at least one of the first and second operational circuits 52, 53 may be employed. That is, a circuit performing at least two of the steps 61–63 of FIG. 13 in a single step may be employed.

Further, a circuit integrating the comparator 54 and at least one of the first to third operational circuits 52, 53, 55 may be employed.

The operation of the third operational circuit 55 may be performed through a current mode. In this case, the results of the mathematical operations performed by the first and second operational circuits 52, 53 are converted to a current. Alternatively, the first to third operational circuits 52, 53, 55 may perform mathematical operations by converting the analog signal Vin and at least one of the first and second comparison voltages Vref, GND to a current. The order and structure of the mathematical operations may be changed as required.

A potential between the first comparison voltage Vref and a second comparison voltage GND (first reference voltage VRH and second reference voltage VRL) may be set as the virtual comparison voltage. Alternatively, two or more potentials between the first comparison voltage and the second comparison voltage GND may be set as the virtual comparison voltage.

In this case, when the potential of the analog signal Vin is close to the median voltage, erroneous functioning caused by noise superimposed on the analog signal Vin is prevented. For example, if noise is superimposed on an analog signal Vin having a potential lower than the median potential, the analog signal Vin may become greater than the median potential. This may produce an error in the determination result.

The A/D converter of the present invention may be applied to a successive approximation A/D converter or a cyclic comparison A/D converter. When the present invention is applied to a successive approximation A/D converter, an analog block includes only one bit cell (e.g., the bit cell 41). The bit cell 41 performs mathematical operations for an n number of times (eight times to correspond with the preferred embodiment) to generate an eight-bit digital output signal. When the present invention is applied to a cyclic comparison A/D converter, an analog block includes an m number (2=m<n) of bit cells (e.g., the two bit cells 41, 42). The output of the second bit cell 42 is fed back to the input terminal of the first bit cell 41, and each of the bit cells 41, 42 perform, for example, four mathematical operations to generate an eight-bit digital output signal.

The bit number of the A/D converted digital signal Dout may be changed as required.

The present examples and embodiments are to be considered as illustrative and not restrictive, and the invention is not to be limited to the details given herein, but may be modified within the scope and equivalence of the appended claims.

What is claimed is:

1. An A/D converter comprising:
   a bit cell for converting an analog input signal to a single-bit digital signal, wherein the bit cell includes an operational circuit for performing,
   a first operation that is one of (Vin−VRH) and (VRH−Vin) to generate a first result,
   a second operation that is one of (Vin−VRL) and (VRL−Vin) to generate a second result, and
   a third operation that is the addition of the first result and the second result to generate a third result, wherein VRH is a high potential reference voltage, VRL is a low potential reference voltage, and Vin is the voltage of the analog input signal.

2. The A/D converter according to claim 1, wherein the bit cell is one of a plurality of series-connected bit cells, and the operational circuit of each of the bit cells transmits the third result to the next bit cell.

3. The A/D converter according to claim 1, wherein the operational circuit compares the voltage of the analog input signal to at least one potential level virtually set between the high potential reference voltage and the low potential reference voltage.

4. The A/D converter according to claim 1, wherein the operational circuit comprises a differential circuit.

5. The A/D converter according to claim 1, wherein the operational circuit performs the third operation in a current mode.

6. The A/D converter according to claim 1, wherein the bit cell is one of a plurality of series-connected bit cells, the number of which corresponds to the number of bits of the digital signal.

7. The A/D converter according to claim 1, wherein the first to third operations of the bit cell are performed at least twice in a cyclic manner.

8. The A/D converter according to claim 1, wherein the bit cell performs successive approximation.

9. An A/D converter comprising:
a bit cell for converting an analog input signal to a single-bit digital signal, wherein the bit cell includes,
a first operational circuit for performing a first operation Vin−VRH to obtain a first operation result Va,
a second operational circuit for performing a second operation Vin−VRL to obtain a second operation result Vb, and
a third operational circuit connected to the first and second operational circuits to perform a third operation Va+Vb and obtain a third operation result, wherein VRH is a high potential reference voltage, VRL is a low potential reference voltage, and Vin is the voltage of the analog input signal.

10. The A/D converter according to claim 9, further comprising:
a comparator connected to the first and second operational circuits, wherein the comparator compares the first operation result Va and the second operation result Vb to generate the digital signal.

11. The A/D converter according to claim 10, wherein the third operational circuit performs the third operation in parallel with the comparison performed by the comparator.

12. The A/D converter according to claim 9, wherein the bit cell compares the voltage of the analog input signal to at least one potential level virtually set between the high potential reference voltage and the low potential reference voltage.

13. The A/D converter according to claim 9, wherein the bit cell is one of a plurality of series-connected bit cells, and the third operational circuit of each of the bit cells transmits one of the third operation result and an inverse of the third operation result to the next bit cell.

14. The A/D converter according to claim 9, wherein the first and second operational circuits each comprise a differential circuit.

15. The A/D converter according to claim 9, wherein the third operational circuit performs the third operation in a current mode.

16. The A/D converter according to claim 9, wherein the bit cell is one of a plurality of series-connected bit cells, the number of which corresponds to the number of bits of the digital signal.

17. The A/D converter according to claim 9, wherein the first to third operations are performed at least twice in a cyclic manner.

18. The A/D converter according to claim 9, wherein the bit cell performs successive approximation.

19. An A/D converter comprising:
a bit cell for converting an analog input signal to a single-bit digital signal, wherein the bit cell includes,
a first operational circuit for performing a first operation VRH−Vin to obtain a first operation result Va,
a second operational circuit for performing a second operation VRL−Vin to obtain a second operation result Vb, and
a third operational circuit connected to the first and second operational circuits to perform a third operation Va+Vb and obtain a third operation result, wherein VRH is a high potential reference voltage, VRL is a low potential reference voltage, and Vin is the voltage of the analog input signal.

20. The A/D converter according to claim 19, further comprising:
a comparator connected to the first and second operational circuits, wherein the comparator compares the first operation result Va and the second operation result Vb to generate the digital signal.

21. The A/D converter according to claim 20, wherein the third operational circuit performs the third operation in parallel with the comparison performed by the comparator.

22. The A/D converter according to claim 19, wherein the bit cell compares the voltage of the analog input signal to at least one potential level virtually set between the high potential reference voltage and the low potential reference voltage.

23. The A/D converter according to claim 19, wherein the bit cell is one of a plurality of series-connected bit cells, and the third operational circuit of each of the bit cells transmits one of the third operation result and an inverse of the third operation result to the next bit cell.

24. The A/D converter according to claim 19, wherein the first and second operational circuits each comprise a differential circuit.

25. The A/D converter according to claim 19, wherein the third operational circuit performs the third operation in a current mode.

26. The A/D converter according to claim 19, wherein the bit cell is one of a plurality of series-connected bit cells, the number of which corresponds to the number of bits of the digital signal.

27. The A/D converter according to claim 19, wherein the first to third operations are performed at least twice in a cyclic manner.

28. The A/D converter according to claim 19, wherein the bit cell performs successive approximation.

29. An A/D converter comprising:
a bit cell for converting an analog input signal to a digital signal, wherein the bit cell includes,
a sample-and-hold circuit for sampling and holding the analog input signal,
a first operational circuit for obtaining the difference between a voltage of the sampled and held analog signal and a high potential reference voltage to generate a first differential voltage signal,
a second operational circuit for obtaining the difference between the voltage of the sampled and held analog signal and a low potential reference voltage to generate a second differential voltage signal,
a comparator connected to the first and second operational circuits to compare the first and second differential voltage signals, and
a third operational circuit connected to the first and second operational circuit to add the first differential voltage signal and the second differential voltage signal to generate complementary first and second analog output signals, wherein the comparator outputs one of the first and second analog output signals.

30. The A/D converter according to claim 29, wherein the third operational circuit performs the add operation in parallel with the comparison performed by the comparator.

31. The A/D converter according to claim 29, wherein the first and second operational circuits each comprises a differential circuit.

32. The A/D converter according to claim 29, wherein the bit cell is one of a plurality of series-connected bit cells, and the third operational circuit of each of the bit cells transmits one of the first and second analog output signals to the next bit cell.

33. The A/D converter according to claim 29, wherein the third operational circuit performs the operation in a current mode.

34. The A/D converter according to claim 29, wherein the bit cell is one of a plurality of series-connected bit cells, the number of which corresponds to the number of bits of the digital signal.

35. The A/D converter according to claim 29, wherein the bit cell is provided with the analog output signal at least twice in a cyclic manner.

36. The A/D converter according to claim 29, wherein the bit cell performs successive approximation.

37. A method for converting an analog input signal to a digital signal, the method comprising the steps of:

computing a difference between the analog input signal and a high potential reference voltage to obtain a first operation result;

computing a difference between the analog input signal and a low potential reference voltage to obtain a second operation result;

computing a sum of the first and second operation results to obtain a third operation result;

generating one of a first digital signal and a second digital signal by determining whether the third operation result is positive; and outputting one of the third operation result and an inverse of the third operation result based on the determination result.

38. A method for converting an analog input signal to a digital signal, the method comprising the steps of:

sampling and holding the analog input signal;

computing the difference between a voltage of the sampled and held analog signal and a high potential reference voltage to obtain a first operation result;

computing the difference between the voltage of the sampled and held analog signal and a low potential reference voltage to obtain a second operation result;

comparing the first and second operation results to generate one of a first digital signal and a second digital signal;

computing the sum of the first and second operation results to obtain a third operation result; and outputting one of the third operation result and an inverse of the third operation result based on the generated one of the first and second digital signals.

39. The method according to claim 38, wherein the comparing step is performed in parallel with the third operation result computing step.

* * * * *